Figure 1:
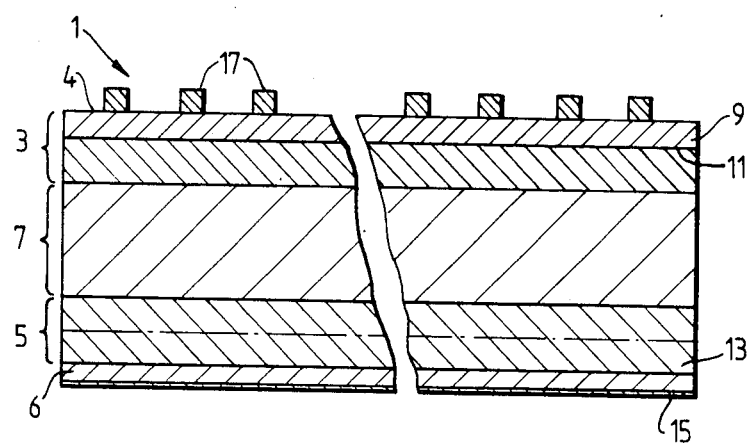

United States Patent [19]

Markvart et al.

[11] Patent Number: 4,681,983
[45] Date of Patent: Jul. 21, 1987

[54] SEMICONDUCTOR SOLAR CELLS

[75] Inventors: Tomas Markvart; Arthur F. W. Willoughby, both of Southampton, England

[73] Assignee: The Secretary of State for Defence in Her Majesty's Government of the United Kingdom of Great Britain and Northern Ireland, London, England

[21] Appl. No.: 777,343

[22] Filed: Sep. 18, 1985

[30] Foreign Application Priority Data

Sep. 18, 1984 [GB] United Kingdom ............... 8423558

[51] Int. Cl.⁴ ..................... H01L 31/06; H01L 31/18
[52] U.S. Cl. ....................................... 136/255; 29/572;
29/576 B; 148/1.5; 148/176; 148/DIG. 60;
136/252; 136/261; 136/262
[58] Field of Search .............. 136/252, 255, 261, 262,
136/290; 29/572, 576 B; 148/1.5, 176, DIG. 60

[56] References Cited
FOREIGN PATENT DOCUMENTS 0066461 8/1982 European Pat. Off. .... 148/DIG. 60

OTHER PUBLICATIONS

F. S. D'Aragona et al, Solar Cells, vol. 10, pp. 129-143 (1983).
K. Nagasawa et al, Appl. Phys. Lett., vol. 37, pp. 622-624 (1980).

Primary Examiner—Aaron Weisstuch
Attorney, Agent, or Firm—Stevens, Davis, Miller & Mosher

[57] ABSTRACT

A photovoltaic solar cell comprises a piece of semiconductor material incorporating a p-type region, an n-type region, a p-n junction between the two, electrodes contacting the two regions, and within its body a lattice defect denuded zone and a lattice defect gettering zone.

The defect gettering zone may be a precipitate-rich zone or a region of lattice damage. The denuded zone may include the p-n junction.

The semiconductor material may be Si, GaAs or InP.

Methods for making the solar cell are described, involving heat treatment steps to produce a denuded zone, nucleating precipitates and generating precipitates. Alternatively precipitation may be nucleated, or a lattice damage zone may be generated, by proton bombardment.

11 Claims, 1 Drawing Figure

SEMICONDUCTOR SOLAR CELLS

The present invention relates to photovoltaic semiconductor solar cells.

Solar cells comprise a thin wafer of single crystal semiconductor which contains a p-n junction. When exposed to incident electromagnetic radiation, photoelectric excitation occurs as the radiation is absorbed within the bulk of the semiconductor, generating an electron-hole pair. Those carriers which are minority carriers, ie electrons in the p-type region and positive holes in the n-type region, migrate towards and across the p-n junction, thus setting a potential difference across the p-n junction and hence across the semiconductor wafer, from which electric power may be drawn off by appropriately placed electrodes.

One of the principal uses of solar cells is as power sources in space vehicles such as satellites. In space however, solar cells are subjected to continuous irradiation by high energy nuclear particles including electrons, protons, alpha particles and heavier nuclei. These particles form primary defects, normally 'point defects' ie interstitials or vacancies. These primary defects are highly mobile and migrate through the lattice to combine with each other, or with impurity atoms or defects already present to form larger, more static secondary defects.

As the main mechanism of electrical conduction is the migration of electron-hole pairs through the bulk of the semiconductor it is desirable for maximum efficiency to remove any obstacles within the semiconductor to their movement. Electrons and holes move relatively easily through a perfect semiconductor crystal lattice, but lattice defects scatter or trap them. Secondary defects within the lattice are particularly adept at trapping electrons and holes. These effects either hinder or entirely prevent the migrating electrons and holes from reaching the p-n junction. This problem is augmented by the fact that solar cells use substantial thicknesses of semiconductor, eg up to about 1000 $\mu$m, typically 50–300 $\mu$m, to achieve maximum absorption of incident radiation. Electrons and holes are thus required to migrate through relatively large distances in solar cells and the likelihood of their encountering an obstacle on their way to the p-n junction is considerably increased.

Ultimately satellites powered by solar cells can fail because of these problems caused by particle irradiation damage. Although contemporary technology may allow recovery and repair of an orbiting satellite this is extremly expensive and inconvenient, and it is an object of the present invention to improve the resistance to particle irradiation damage of a semiconductor p-n junction solar cell.

According to the present invention a photovoltaic solar cell comprises a piece of semiconductor material incorporating a first region which is p-type, a second region which is n-type, a p-n junction between the two and electrodes on different surfaces of the piece a first electrode making contact with the first region and a second electrode making contact with the second region, and characterised in that the piece incorporates in its body a lattice defect gettering zone and a defect denuded zone extending between the p-n junction and the lattice defect gettering zone.

The lattice defect gettering zone is an area within the semiconductor which acts as an internal trap for migrating lattice defects, particularly primary defects formed as a direct result of irradiation damage. In a solar cell according to the invention the formation of secondary defects in the vicinity of the p-n junction is reduced as primary defects migrate towards and are trapped within the gettering zone, forming trapped secondary defects there. The generation of secondary defects in the regions through which the charge carrying electrons and holes pass is thus reduced, and there is less likelihood of capture of electrons and holes on their way to the p-n junction.

In a particularly preferred form of the present invention the lattice defect gettering zone is a precipitate rich zone, being a zone rich in impurity-induced precipitates.

In one form of the present invention the piece of semiconductor material is a single crystalline wafer having the p-n junction formed within the wafer near to one surface thereof which will hereinafter be referred to as the top surface. In this case the region extending from the p-n junction to the top surface, the top surface layer, is of n-type material, preferably n+-type material, and the body or substrate of the wafer beneath the p-n junction is of p-type material. The region in which the denuded zone is formed extends from the top surface through the part of the wafer where the n-type top surface layer and the p-n junction are formed or are to be formed and into part of the p-type substrate. The lattice defect gettering zone, which may be a precipitate-rich zone is formed in the p-type substrate beneath the denuded zone.

The semiconductor material may be any one of those normally used for p-n junction solar cells, ie silicon, germanium, gallium arsenide, or indium phosphide. Silicon is the material most often used. The p- and n-regions are formed by doping techniques well known in the art, ie to produce a p-type region, doping with a group III element such as boron is used, and to produce an n-type region, doping with a group V element such as phosphorus is used. Doping may be by diffusion from a surface contacting compound containing the element or by ion implantation of the element.

It is preferable (although not essential) for the substrate to be p-type and the top surface layer to be n-type in the specific form described because the radiation damage resistance of cells having such a structure is superior to cells having an n-type substrate carrying a p-type top surface layer.

The surface area of the wafer used to form the cell may be greater than 1 cm$^2$, eg typically 4 cm$^2$, and its thickness may be in the range 5 to 1000 $\mu$m, typically 50 to 300 $\mu$m.

As in known cells, in the above described specific form the top surface n-type layer may have a majority carrier concentration of typically between $10^{17}$ and $10^{19}$ cm$^{-3}$ and the p-type substrate may have a majority carrier concentration of between $10^{15}$ and $10^{17}$ cm$^{-3}$, giving a resistivity of between about 0.1 and 100 ohm-cm, typically about 1 to 10 ohm-cm.

In the specific form described above the n-type top surface layer may have the same thickness as in known cells, eg a thickness less than 1 micron (1 $\mu$m), and may be formed conventionally on the substrate, eg by doping with phosphorus.

Preferably the wafer is Czochralski grown (ie pulled from the melt).

The substrate may for example be doped with boron to produce a p-type region. Suitable boron-doped Czochralski grown wafers are commercially available.

The surface of the wafer remote from the top surface will hereinafter be referred to as the back surface. The wafer, adjacent to the back surface, may contain a p+-type region as in known cells to provide a back surface field which serves to increase conductivity near the back surface. A further denuded zone may be formed in the wafer near the back surface when the denuded zone near the top surface is formed. The further zone is formed in a region which includes the region doped p+-type to provide the back surface field. A good ohmic metal contact, eg a layer of aluminium, is desposited on the back surface in a known way.

An electrode is deposited on the top surface and may be formed in a known way. It preferably comprises a structure comprising multiple spaced units, eg fingers, connected together, the spaces between the units allowing solar radiation to fall upon the wafer to provide operation of the cell. The top surface electrode may for example be formed of a known silver-titanium alloy containing about 99% by weight of silver. The electrode is typically 1 to 10 $\mu$m, eg 5 $\mu$m thick, and the units are typically 0.1 to 10 mm, eg 1 mm, wide.

The structure of the electrode on the top surface may be formed by conventional photolithographic and selective chemical etching techniques or by conventional desposition through a mask.

As in conventional solar cells, an antireflection coating, eg of $TiO_2$ typically 1500 Angstroms thick, is preferably deposited on the top surface.

In order to provide a suitable output voltage the cell according to the invention may be one of an array of cells.

The cell or array of cells may be hermetically sealed in a conventional way, eg between glass or transparent plastic plates. These can serve as a filter for protons incident on the cell.

The formation of a denuded zone with an underlying precipitate-rich zone is known, although such a zone has never hitherto been formed in a wafer for use in a photovoltaic solar cell.

In the solar cell according to the present invention the denuded zone may have a thickness (depth from the top surface) of 1 to 100 $\mu$m, eg 2 to 50 $\mu$m, especially 5 to 30 $\mu$m.

The nature of the precipitate in the precipitate-rich zone will depend upon the nature of the semiconductor material. In silicon the precipitate is most conveniently the oxide. Oxygen is frequently found as an impurity in commercially available silicon semiconductor wafers, and this oxygen may be driven out to form a denuded zone and precipitated to form a precipitate-rich zone by heat treatment at suitable temperatures.

In gallium arsenide the precipitate is arsenic, and is phosphorus in indium phosphide.

The denuded zone and the precipitate-rich zone may be formed in the semiconductor material of the cell according to the present invention for example by the method described by R. A. Craven in the following reference, herein referred to as Reference A: Semiconductor Silicon 1981 (Electrochem. Soc. N.Y.) pages 254–265. In that method essentially a denuding heat treatment in an inert atmosphere at 900°–1100° C. is applied to a silicon wafer, followed by ramping down the temperature to 650° C. and heating at this lower temperature in an inert atmosphere to generate nuclei for the subsequent precipitation stage.

Finally, a precipitation anneal is aplied by heating at 1050° C. in an inert atmosphere. It is shown in Reference A how the depth to which the denuded zone extends may be controllably varied by adjusting the temperature and/or time of the heat treatment phases in the method described in that reference.

By the heat treatment method described in Reference A it is principally the impurity oxygen which is driven from the silicon wafer during the denuded zone formation. During the nucleation and precipitation steps oxygen precipitates, eg of silicon dioxide, are formed in the wafer beneath the denuded zone. The starting wafer is uniformly oxygen rich for this purpose.

An alternative method of forming the lattice defect gettering zone involves bombarding a surface, preferably the top surface, of the semiconductor wafer with energetic protons. It is known that energetic protons penetrate a semiconductor lattice to a depth depending upon their energy, and cause the most lattice damage in the very last part of their journey into the semiconductor. This zone of lattice damage, may at low levels of damage act as a zone of nuclei for precipitation of oxides or other materials in a subsequent precipitation heat treatment as described above, or at higher levels of damage by a longer time of bombardment may itself act as a lattice defect gettering zone.

The bombardment with protons may take place at room temperature. In silicon, for example, protons of 0.1 MeV energy penetrate to about 1 micron, and protons of 4 MeV energy penetrate to about 100 microns. Figures for other energies in silicon, or for other materials may be experimentally determined or are in some cases available in literature.

By using proton bombardment a lattice defect gettering zone of closely defined width may be formed at a closely defined depth from the surface of the semiconductor. An optimum depth for a zone formed in this way is 10–20 microns from the top surface.

The following fabrication sequence may be included in the formation of a solar cell according to the present invention. A commercially available p-type silicon wafer is heat treated by the above method to form a denuded zone extending from its top surface (as well as a further denuded zone extending from its back surface) and a precipitate-rich zone beneath in the interior of the wafer. An n+ layer is then formed on the top surface within the denuded zone so that the region in which the denuded zone has been formed includes the n+ layer, part of the p-type substate and the p-n junction between the two. The p+ layer adjacent to the back surface is formed after the heat treatment and either before or after formation of the n+ type surface layer.

An embodiment of the present invention will now be described by way of example with reference to the accompanying drawing.

FIG. 1 is a schematic cross-sectional side view (not to scale) of a solar cell embodying the present invention.

In FIG. 1 a Czochralski grown p-type single crystal silicon wafer (1) some 100 microns thick has formed in it a denuded zone (3) some 30 microns thick extending into the wafer (1) from the wafer top surface (4) and a denuded zone (5) some 30 microns thick extending into the wafer (1) from the wafer back surface (6). A precipitate-rich zone (7) is formed in the wafer (1) between the denuded zones (3) and (5). An n+-type top surface layer (9) less than 1 micron thick is formed in the wafer (1) within the denuded zone (3) adjacent to the top surface (4) by phosphorus doping, providing a p-n junction (11) between the n+-type layer (9) and the remainder of the p-type wafer (1). A p+-type back surface field layer (13)

is formed in the denuded zone (5) adjacent to the back surface (6). A silver-titanium alloy electrode layer 5 microns thick (15) is deposited on the back surface (6) and an electrode layer (17) of similar thickness, divided into a series of fingers connected together (the connection not being shown in FIG. 1) is deposited on the top surface (4).

An anti-reflection coating (not shown in FIG. 1) is deposited on the top surface (4). The cell is connected to other cells to form an array (not shown) and the array is sealed between transparent glass or plastic slides (not shown).

In operation, solar light is incident on the wafer (1) through the top surface (4) via the spaces between the fingers of the electrode (17). Electron-hole pairs are generated by the light essentially in the p-type wafer (1) especially between the p-n junction 11 and the precipitate rich zone (7). The minority carrier electrons diffuse towards the p-n junction (11) contributing to a potential difference between the electrode (15) and the electrode (17), from which power may be drawn.

When the cell shown in FIG. 1 is exposed to particle irradiation, primary defects created in the p-type wafer (1), in particular those created between the p-n junction (11) and the precipitate rich zone (7), diffuse towards and into the precipitate-rich zone (7) and become trapped there. Their effect in producing secondary defects near the p-n junction (11) is reduced. This improvement can be demonstrated by exposing the cell and a comparative known cell to a particle beam such as an electron beam under the conditions of a standard test, and observing (over a period of time) the degradation in performance of the cells.

We claim:

1. A photovoltaic solar cell which comprises a piece of Czochralski-grown semiconductor material incorporating a first region which is p-type, a second region which is n-type, a p-n junction between the two and electrodes on different surfaces of the piece, a first electrode making contact with the first region and a second electrode making contact with the second region, wherein the piece incorporates in its body a lattice defect gettering zone and a defect denuded zone extending between the p-n junction and the lattice defect gettering zone, said denuded zone having a thickness of 100 microns or less as measured from a surface of said cell on which solar radiation is intended to fall.

2. A photovoltaic solar cell according to claim 1 wherein the lattice defect gettering zone is a precipitate-rich zone.

3. A photovoltaic solar cell according to claim 2 wherein the precipitate is selected from the group consisting of silicon oxide in silicon, arsenic in gallium arsenide, and phosphorus in indium phosphide.

4. A photovoltaic solar cell according to claim 1 wherein the lattice defect gettering zone is a zone of lattice damage.

5. A solar cell according to claim 1 wherein the region in which the defect denuded zone is formed extends from one surface of the piece to the lattice defect gettering zone, the p-n junction being in this region.

6. A photovoltaic solar cell according to claim 1 wherein the semiconductor material is selected from the group consisting of silicon, germanium, gallium arsenide, and indium phosphide.

7. A photovolatic solar cell according to claim 1 wherein: (a) the piece of semiconductor material is a single crystalline wafer having the p-n junction formed within the wafer near to a first surface thereof, (b) the region extending from the p-n junction to the first surface is of $n^+$-type material, and the body or substrate of the wafer beneath the p-n junction is of p-type material, (c) the region in which the denuded zone is formed extends from the first surface through the part of the wafer where the n-type layer and the p-n junction are formed and into part of the p-type substrate, and (d) the lattice defect gettering zone is formed in the p-type substrate beneath the denuded zone.

8. A photovoltaic solar cell according to claim 7 wherein the wafer adjacent to the surface thereof remote from the said first surface contains a further denuded zone and a $p^+$-type layer within that denuded zone.

9. A method of making a photovoltaic solar cell comprising the steps of:
 (a) applying a denuding heat treatment to a wafer of a Czochralski-grown semiconductor material,
 (b) nucleating precipitates at a lower temperature and in an inert atmosphere, and
 (c) applying a precipitate yielding anneal at a higher temperature greater than that of step (b) so as to form a denuded zone having a thickness of 100 microns or less as measured from the surface of the cell on which solar radiation is intended to fall.

10. A method according to claim 9 wherein step (b) is replaced by a proton bombardment of the wafer.

11. A method according to claim 9 wherein steps (b) and (c) are replaced by a proton bombardment.

* * * * *